US011211105B2

(12) United States Patent
Shaeffer et al.

(10) Patent No.: US 11,211,105 B2
(45) Date of Patent: *Dec. 28, 2021

(54) MEMORY DEVICE COMPRISING PROGRAMMABLE COMMAND-AND-ADDRESS AND/OR DATA INTERFACES

(71) Applicant: Rambus Inc., San Jose, CA (US)

(72) Inventors: Ian Shaeffer, Los Gatos, CA (US); Lawrence Lai, San Jose, CA (US); Fan Ho, San Ramon, CA (US); David A. Secker, San Jose, CA (US); Wayne S. Richardson, Saratoga, CA (US); Akash Bansal, Santa Clara, CA (US); Brian S. Leibowitz, San Francisco, CA (US); Kyung Suk Oh, Cupertino, CA (US)

(73) Assignee: Rambus Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/987,157

(22) Filed: Aug. 6, 2020

(65) Prior Publication Data

US 2021/0050043 A1 Feb. 18, 2021

Related U.S. Application Data

(63) Continuation of application No. 16/222,909, filed on Dec. 17, 2018, now Pat. No. 10,770,124, which is a
(Continued)

(51) Int. Cl.
*G11C 5/02* (2006.01)
*G11C 8/12* (2006.01)
(Continued)

(52) U.S. Cl.
CPC ............... *G11C 8/12* (2013.01); *G11C 5/02* (2013.01); *G11C 5/04* (2013.01); *G11C 5/06* (2013.01);
(Continued)

(58) Field of Classification Search
CPC .... G11C 8/12; G11C 5/02; G11C 5/04; G11C 5/06; G11C 5/063; G11C 7/1012; G11C 7/1045; G11C 8/18; H01L 24/49
(Continued)

(56) References Cited

U.S. PATENT DOCUMENTS 6,362,525 B1 * 3/2002 Rahim ............. H01L 23/49838
257/528
7,546,435 B2 6/2009 LaBerge
(Continued)

*Primary Examiner* — Huan Hoang
(74) *Attorney, Agent, or Firm* — Park, Vaughan, Fleming & Dowler LLP; Laxman Sahasrabuddhe

(57) ABSTRACT

A memory device comprising a programmable command-and-address (CA) interface and/or a programmable data interface is described. In an operational mode, two or more CA interfaces may be active. In another operational mode, at least one, but not all, CA interfaces may be active. In an operational mode, all of the data interfaces may be active. In another operational mode, at least one, but not all, data interfaces may be active. The memory device can include circuitry to select: an operational mode; a sub-mode within an operational mode; one or more CA interfaces as the active CA interface(s); a main CA interface from multiple active CA interfaces; and/or one or more data interfaces as the active data interfaces. The circuitry may perform these selection(s) based on one or more bits in one or more registers and/or one or more signals received on one or more pins.

20 Claims, 12 Drawing Sheets

Related U.S. Application Data continuation of application No. 15/623,261, filed on Jun. 14, 2017, now Pat. No. 10,192,598, which is a continuation of application No. 14/813,028, filed on Jul. 29, 2015, now Pat. No. 9,734,879, which is a continuation of application No. 13/753,360, filed on Jan. 29, 2013, now Pat. No. 9,117,496.

(60) Provisional application No. 61/592,521, filed on Jan. 30, 2012.

(51) Int. Cl.
    *G11C 5/06*     (2006.01)
    *G11C 8/18*     (2006.01)
    *H01L 25/065*     (2006.01)
    *G11C 5/04*     (2006.01)
    *G11C 7/10*     (2006.01)
    *H01L 23/00*     (2006.01)

(52) U.S. Cl.
CPC ............ *G11C 5/063* (2013.01); *G11C 7/1012* (2013.01); *G11C 7/1045* (2013.01); *G11C 8/18* (2013.01); *H01L 24/49* (2013.01); *H01L 25/0657* (2013.01); *H01L 24/32* (2013.01); *H01L 24/48* (2013.01); *H01L 24/73* (2013.01); *H01L 2224/16225* (2013.01); *H01L 2224/32145* (2013.01); *H01L 2224/32225* (2013.01); *H01L 2224/45099* (2013.01); *H01L 2224/48095* (2013.01); *H01L 2224/48227* (2013.01); *H01L 2224/48471* (2013.01); *H01L 2224/49171* (2013.01); *H01L 2224/49433* (2013.01); *H01L 2224/73265* (2013.01); *H01L 2225/0651* (2013.01); *H01L 2924/00012* (2013.01); *H01L 2924/00014* (2013.01); *H01L 2924/15311* (2013.01); *H01L 2924/181* (2013.01)

(58) Field of Classification Search
USPC .......................................................... 365/51
See application file for complete search history.

(56) References Cited

U.S. PATENT DOCUMENTS

| | | |
|---|---|---|
| 7,822,936 B2 | 10/2010 | Bartley et al. |
| 7,873,773 B2 | 1/2011 | Bartley et al. |
| 7,996,641 B2 | 8/2011 | Bartley et al. |
| 9,117,496 B2 | 8/2015 | Shaeffer et al. |
| 9,734,879 B2 | 8/2017 | Shaeffer et al. |
| 10,192,598 B2 | 1/2019 | Shaeffer et al. |
| 10,770,124 B2 * | 9/2020 | Shaeffer ............... H01L 25/0657 |
| 2003/0014578 A1 * | 1/2003 | Pax ..................... G06F 13/1647 710/100 |
| 2006/0023878 A1 | 2/2006 | Son |
| 2011/0193086 A1 | 8/2011 | Lee et al. |
| 2011/0194359 A1 | 8/2011 | Nara |
| 2012/0203957 A1 | 8/2012 | Schuette |
| 2012/0300555 A1 | 11/2012 | Shin et al. |

* cited by examiner

MEMORY DEVICE COMPRISING PROGRAMMABLE COMMAND-AND-ADDRESS AND/OR DATA INTERFACES

RELATED APPLICATION

This application is a continuation application of, and claims priority to, U.S. application Ser. No. 16/222,909 which was filed on 17 Dec. 2018. U.S. application Ser. No. 16/222,909, is a continuation application of, and claims priority to, U.S. application Ser. No. 15/623,261 which was filed on 14 Jun. 2017, and which issued as U.S. Pat. No. 10,192,598. U.S. application Ser. No. 15/623,261, is a continuation application of, and claims priority to, U.S. application Ser. No. 14/813,028 which was filed on 29 Jul. 2015, and which issued as U.S. Pat. No. 9,734,879. U.S. application Ser. No. 14/813,028, is a continuation application of, and claims priority to, U.S. application Ser. No. 13/753,360 which was filed on 29 Jan. 2013, and which issued as U.S. Pat. No. 9,117,496. U.S. application Ser. No. 13/753,360 is a non-provisional application of, and claims priority to, U.S. Provisional Application No. 61/592,521, which was filed 30 Jan. 2012. The contents of all of the above-referenced applications are herein incorporated by reference in their entirety for all purposes.

BACKGROUND

Wire routing in a circuit board and/or wire bonding in an integrated circuit (IC) package usually needs to satisfy a set of design constraints that are based on manufacturability and/or performance considerations. It is desirable to design ICs that facilitate wire routing and/or wire bonding.

DETAILED DESCRIPTION

Figure 1:
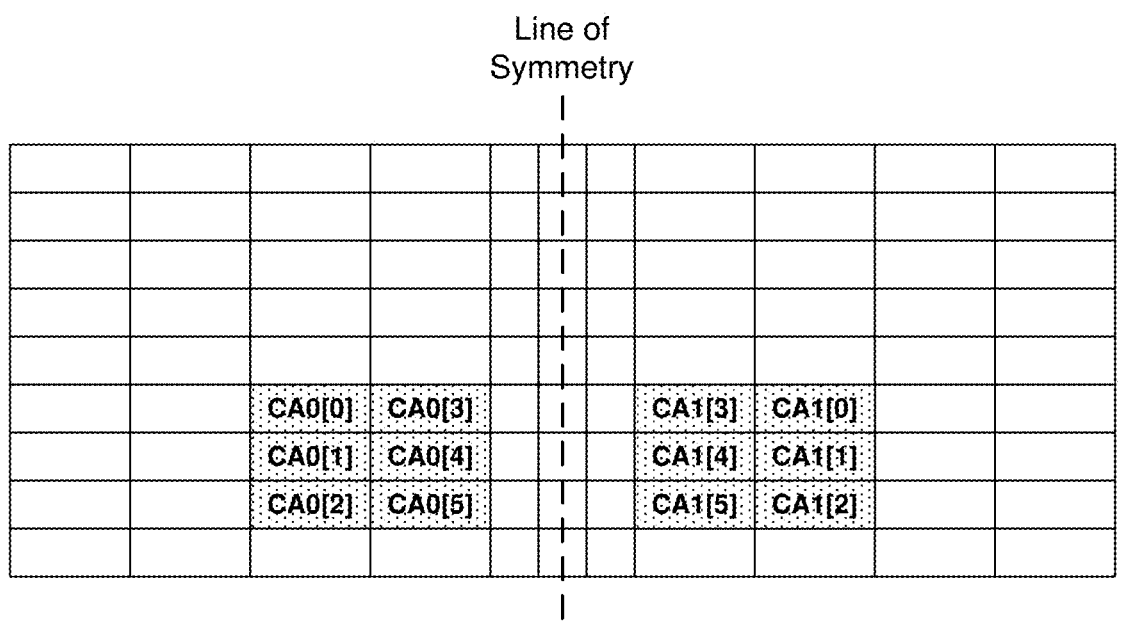
FIG. 1 illustrates a pin layout for a memory device in accordance with some embodiments described herein.

Some embodiments presented in this disclosure feature a memory device comprising programmable command-and-address (CA) and/or data interfaces. In some embodiments, a CA interface can include one or more command signals, one or more address signals, one or more clock enable (CKE) signals, one or more chip select (CS) signals, and/or one or more on-die termination (ODT) signals.

In some embodiments, the memory device can include two or more programmable CA interfaces, wherein the memory device has at least two operational modes. In one operational mode, two or more CA interfaces are active. In another operational mode, only one of the two or more CA interfaces is active. The memory device may also have additional operational modes in which a subset of CA interfaces are active.

In some embodiments described herein, the memory device includes circuitry to select: (1) an operational mode, (2) a sub-mode within an operational mode, (3) one or more CA interfaces as the active CA interface(s), and/or (4) a main CA interface from multiple active CA interfaces. In some embodiments described herein, the circuitry is capable of performing these selection(s) based on one or more bits in one or more registers and/or one or more signals received on one or more pins.

In some embodiments, a memory device can comprise a set of data interfaces, wherein each data interface includes a contiguous set of conducting regions (e.g., pads or pins). The contiguous set of conducting regions corresponding to a data interface can include a strobe signal, a data mask signal, and/or a set of data signals. In some embodiments, when a data interface is active, each conducting region in the corresponding contiguous set of conducting regions is active. In some embodiments, the memory device can support at least two operational modes. In one operational mode, each data interface in the set of data interfaces is active. In a second operational mode, only some (i.e., at least one, but not all) of the set of data interfaces are active.

In this disclosure, the term "memory device" can refer to an IC, an IC die, or an IC package that has multiple data interfaces and/or multiple CA interfaces and that comprises circuitry that is capable of (1) storing data using a volatile or non-volatile storage mechanism, and (2) performing actions in response to receiving command and address information on one or more CA interfaces. Examples of memory devices include, but are not limited to, a volatile memory IC (e.g., a dynamic random-access memory (DRAM) IC, a synchronous double data rate (DDR) DRAM IC, etc.), a non-volatile memory IC (e.g., a Flash memory IC), a die that includes one or more volatile and/or non-volatile memory ICs, and an IC package that comprises one or more dies, wherein each of the one or more dies includes one or more volatile and/or non-volatile memory ICs.

In this disclosure, the term "CA interface" generally refers to one or more conducting regions that are capable of receiving command and address information. An example of a CA interface includes, but is not limited to, a set of pins of an IC package that are used for receiving command and address information, or a set of pads of a die that are used for receiving command and address information.

In this disclosure, the term "data interface" generally refers to a contiguous set of conducting regions of a memory device that is capable of receiving data that is to be written into the memory device and/or transmitting data that was read from the memory device. An example of a data interface includes, but is not limited to, a contiguous set of pins of an IC package that is used for receiving and/or transmitting data, or a contiguous set of pads of a die that is used for receiving and/or transmitting data. In some embodiments, a data interface can include a strobe signal, a data mask signal, and/or a set of data signals. The strobe signal may indicate when the data in the set of data signals is valid, and the data mask signal may indicate whether or not the data in the set of data signals is to be written to the memory device.

The term "pin" as used in this disclosure generally refers to a conducting region of an IC package that is used for receiving and/or sending electrical signals. For example, the term "pin" can refer to a solder ball in a ball-grid-array (BGA).

FIG. 1 illustrates a pin layout for a memory device in accordance with some embodiments described herein.

Each rectangular cell shown in FIG. 1 can be a possible pin location. In some embodiments, pin locations near the center of the memory package, e.g., along the line of symmetry shown in FIG. 1, may not contain pins because the space may be occupied by wiring that connects center I/Os from the die with the IC package.

Different groups of pins can carry different types of signals. For example, in some embodiments, a first group of pins can carry data signals, a second group of pins can carry various data-related signals (e.g., strobes), a third group of pins can carry various CA signals, a fourth group of pins can carry clock signals, a fifth group of pins can carry various per-rank control signals, a sixth group of pins can carry power-related signals, and a seventh group of pins can carry miscellaneous non-power signals (e.g., reset).

In some embodiments, a memory system can provide separate pathways for command/address signals and data signals. For example, in some embodiments, a multi-drop fly-by path can be provided to route command/address signals from a memory controller through multiple memory devices, and a separate direct path can be provided to communicate data signals directly between the memory controller and the memory devices.

In some embodiments, memory devices may be arranged in a clamshell configuration, wherein pairs of memory devices are located on opposite sides of a circuit board. In a clamshell configuration, the pins from opposite sides of the line of symmetry can be located over each other. This can allow the pins to be easily coupled together through a via in the circuit board, wherein the via is electrically coupled to a corresponding signal line in either a fly-by path or a direct path.

A CA interface can comprise one or more CA pins. FIG. 1 illustrates two CA interfaces, each having six CA pins: the first CA interface comprises pins CA0[0]-CA0[5], and the second CA interface comprises pins CA1[0]-CA1[5]. Other embodiments may have more than two CA interfaces, and/or may have a fewer or greater number of pins per CA interface.

Figure 2A:
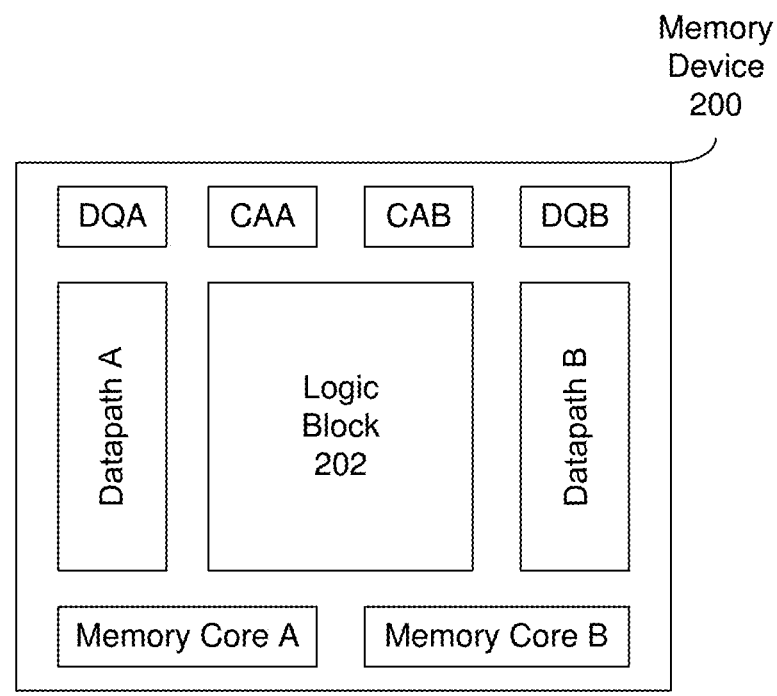
FIG. 2A illustrates some of the resources in a memory device that has multiple configurable CA interfaces in accordance with some embodiments described herein.

FIG. 2A illustrates some of the resources in a memory device that has multiple configurable CA interfaces in accordance with some embodiments described herein. FIG. 2A is for illustration purposes only, and is not intended to limit the scope of the embodiments described herein. Specifically, a memory device may include fewer, more, and/or a different set of resources than those shown in FIG. 2A.

Memory device 200 can include: (1) one or more data interface resources, e.g., DQA and DQB, (2) one or more CA interface resources, e.g., CAA and CAB, (3) one or more logic blocks, e.g., logic block 202, (4) one or more datapath resources, e.g., datapaths A and B, and/or (5) one or more memory cores, e.g., memory cores A and B.

In some embodiments described herein, the one or more memory cores can store data. The one or more logic blocks can interpret the command/address signals received on the one or more CA interfaces. Depending on the command/address information received on the one or more CA interfaces, the memory device can use the data interface and/or the datapath resources to read data from the one or more memory cores and/or write data to the one or more memory cores.

In some embodiments described herein, a memory system can include one or more memory controllers and one or more memory modules. Each memory module (e.g., a circuit board) can include one or more memory devices (e.g., DRAM IC packages) that are arranged in a given configuration (e.g., a clamshell configuration).

The memory system may support one or more module threads, and/or one or more microthreads. A module thread can correspond to an independently controllable group of memory devices in a memory module. For example, a memory module that supports two module threads can include two groups of memory devices that are independently controllable, e.g., the two groups of memory devices can be controlled using two independent sets of command-and-address signals. A microthread can correspond to an independently controllable group of memory resources in a memory device. For example, a memory device that supports two microthreads can include two groups of memory resources that are independently controllable, e.g., the two groups of memory resources can be controlled using two independent sets of command-and-address signals.

In some embodiments described herein, a memory device can have multiple operational modes. In some operational modes, a single CA interface (which may be selectable based on information stored in one or more registers and/or received on one or more pins) from the two or more CA interfaces can be used to provide command and address information to a memory device. This operational mode can be used when the memory system supports a single microthread.

In some operational modes, two or more CA interfaces can be used to provide command and address information to the memory device. This operational mode can be used when the memory system supports multiple microthreads.

In some embodiments described herein, the memory device is capable of selecting a main CA interface in operational modes that have multiple active CA interfaces. This capability can simplify the logic for processing certain commands. The main CA interface can be capable of receiving and processing a command that affects a memory resource that is associated with a CA interface that is different from the main CA interface. For example, a memory controller may send commands that affect the entire memory device (e.g., a calibration, refresh, a power-down command, and/or a register programming command) to the main CA interface.

Figure 2B:
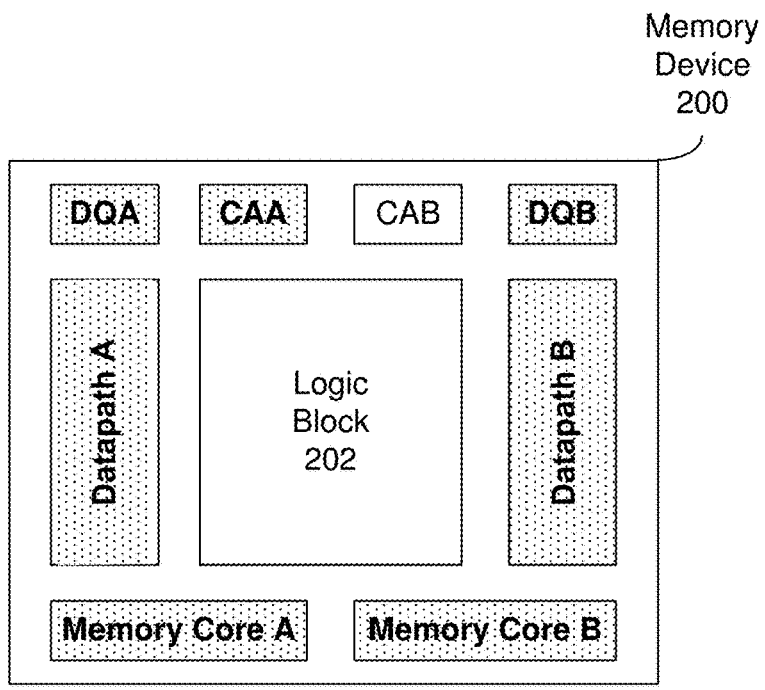
FIGS. 2B-2C illustrate sub-modes of an operational mode that supports a single microthread in accordance with some embodiments described herein.
Figure 2C:
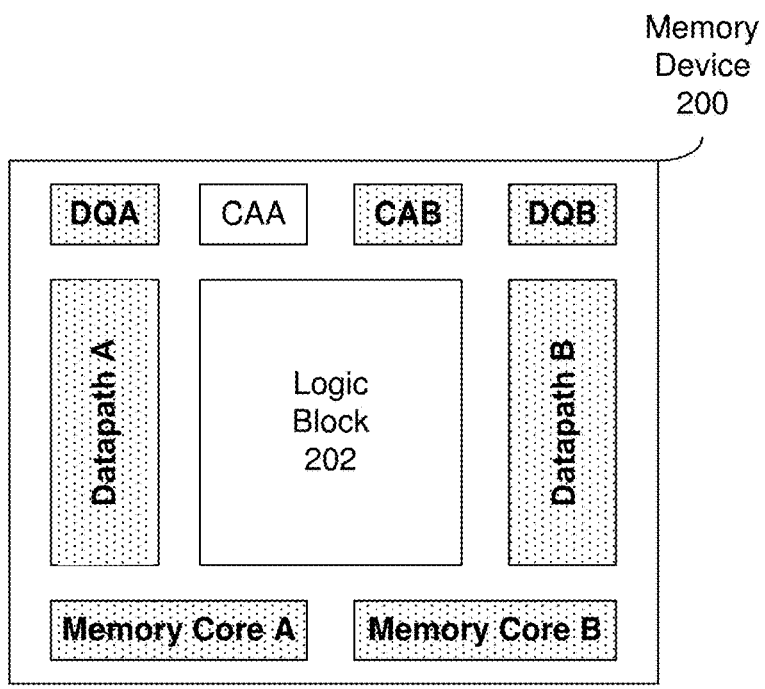

FIGS. 2B-2C illustrate sub-modes of an operational mode that supports a single microthread in accordance with some embodiments described herein.

In the illustrated sub-modes, only one CA interface is active, and the other CA interface(s) are inactive. In the sub-mode shown in FIG. 2B, the active CA interface CAA controls resources DQA, DQB, datapaths A and B, and memory cores A and B. In the sub-mode shown in FIG. 2C, the active CA interface CAB controls resources DQA, DQB, datapaths A and B, and memory cores A and B.

Figure 2D:
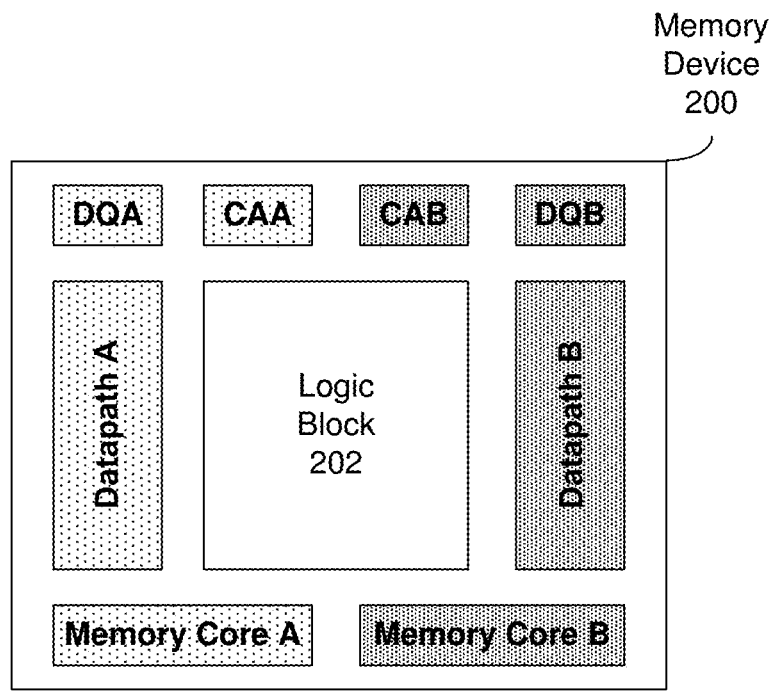
FIGS. 2D-2E illustrate sub-modes of an operational mode that supports multiple microthreads in accordance with some embodiments described herein.
Figure 2E:
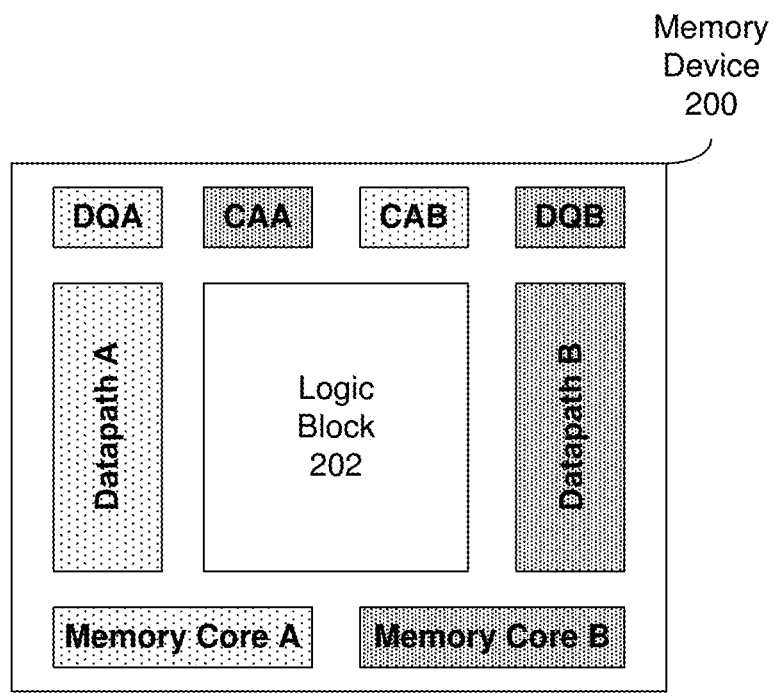

FIGS. 2D-2E illustrate sub-modes of an operational mode that supports multiple microthreads in accordance with some embodiments described herein.

In the illustrated sub-modes, multiple CA interfaces are active. Each active CA interface can correspond to a microthread and control a portion of the resources in memory device 200. In the sub-mode shown in FIG. 2D, the active CA interface CAA controls resources DQA, datapath A, and memory core A, and the active CA interface CAB controls resources DQB, datapath B, and memory core B. In the sub-mode shown in FIG. 2E, the active CA interface CAA controls resources DQB, datapath B, and memory core B, and the active CA interface CAB controls resources DQA, datapath A, and memory core A. In both of these sub-modes, logic 202 may be shared between the two CA interfaces.

Some embodiments described herein allow adjustable threading in a clamshell configuration while supporting clean circuit board routing. Specifically, some embodiments described herein allow configurations in which one or two memory modules are used. In the configuration that uses two memory modules, both memory module slots are populated with a memory module. In the configuration that uses a single memory module, one of the slots is populated with a memory module, and the other slot is populated with a continuity module which acts as a place holder for the missing memory module.

It may be advantageous to use adjustable threading in these two configurations to ensure that the system resources are used efficiently in both configurations.

Figure 3A:
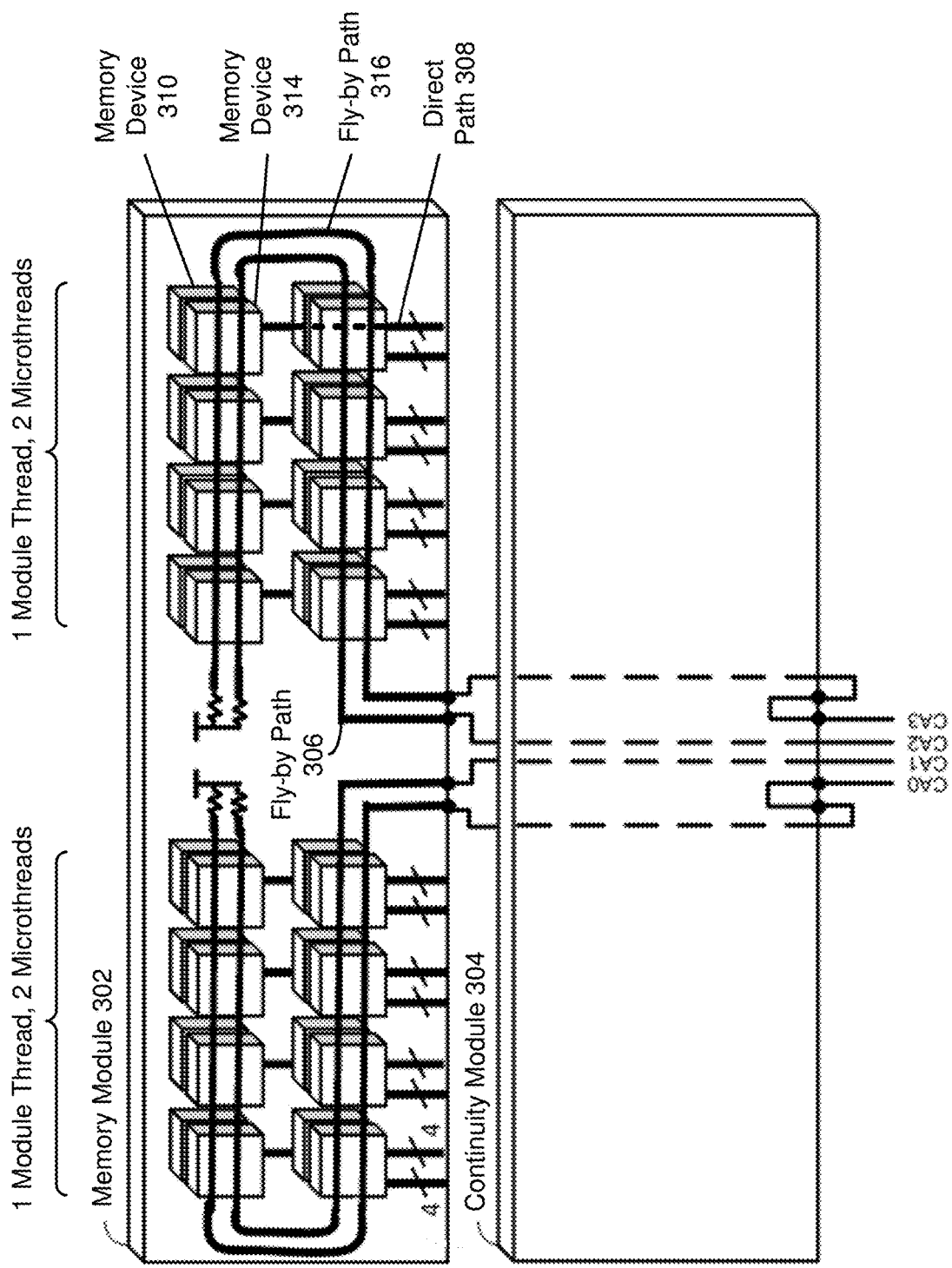
FIG. 3A illustrates a configuration with one memory module in accordance with some embodiments described herein.
Figure 3B:
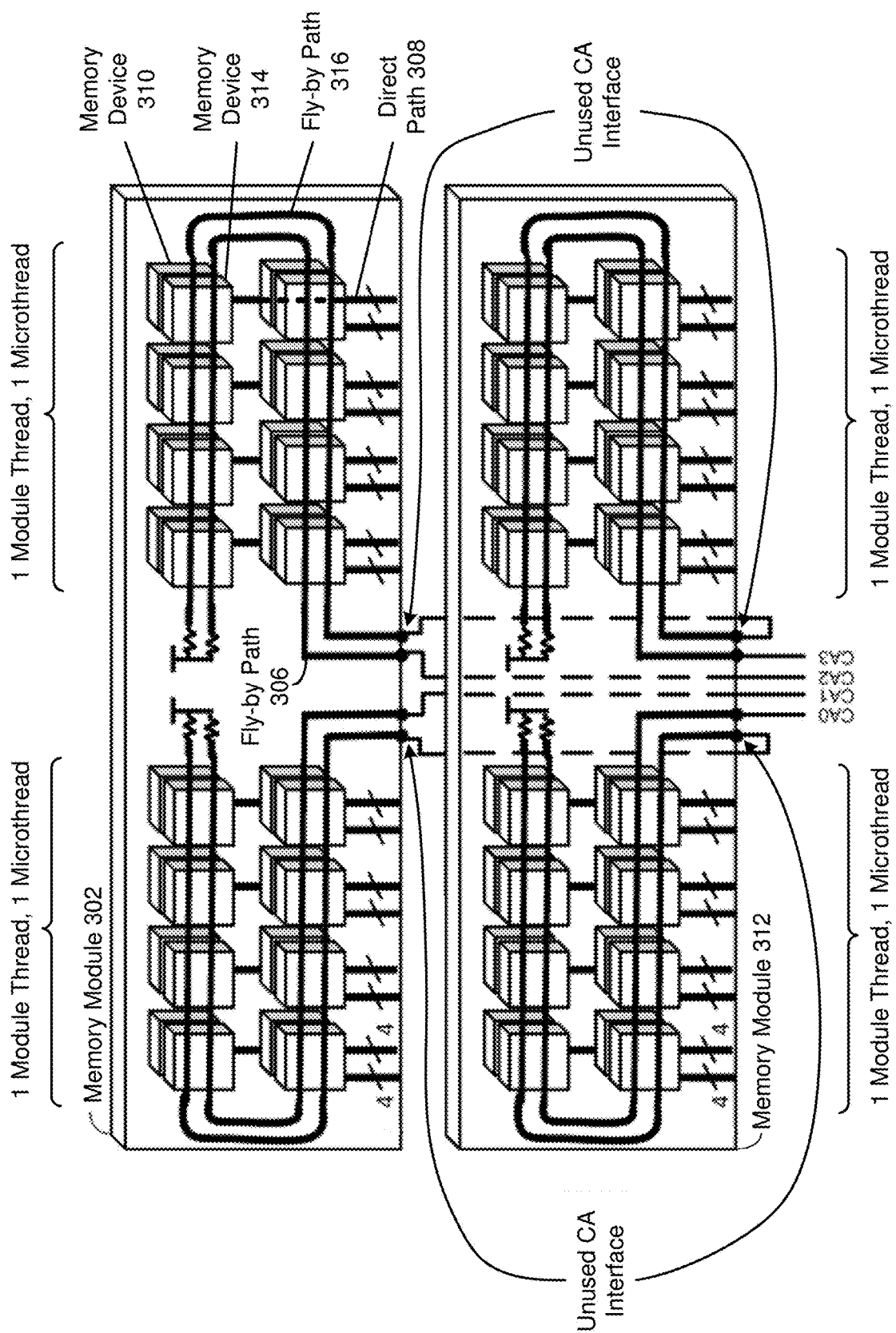
FIG. 3B illustrates a configuration with two memory modules in accordance with some embodiments described herein.
Figure 3C:
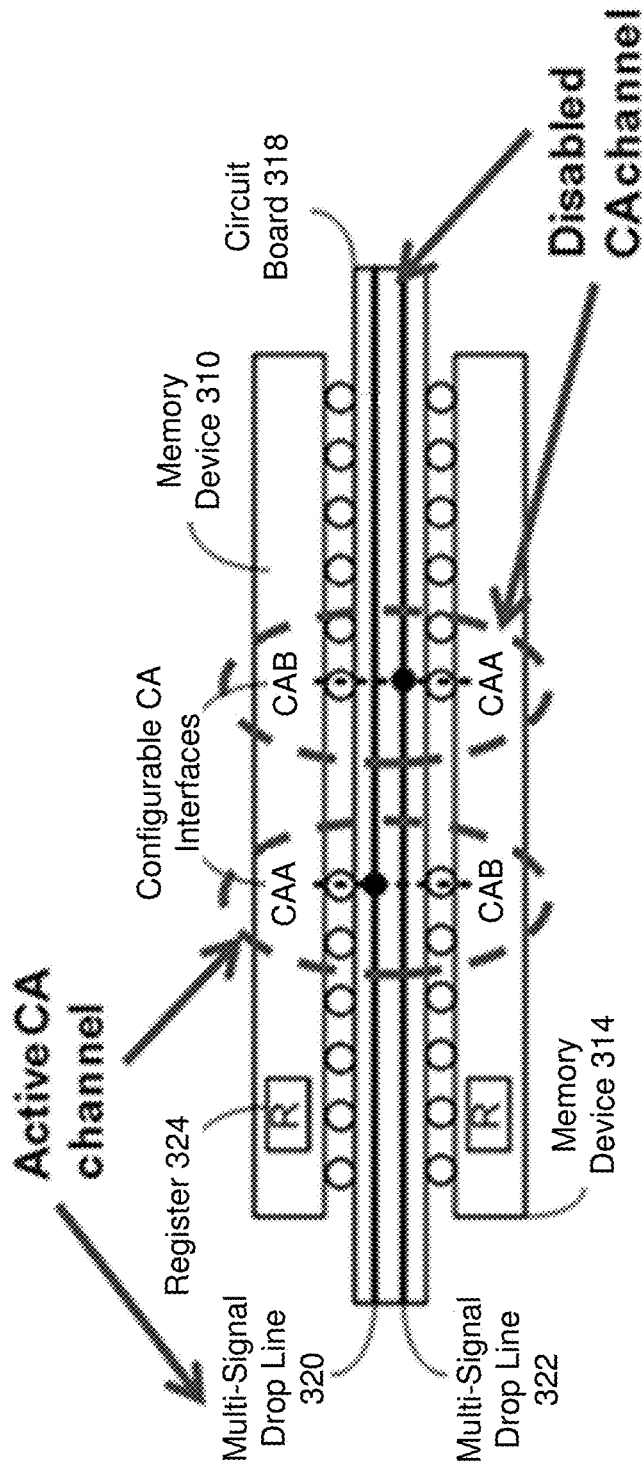
FIG. 3C illustrates a cross-section of a portion of memory module 302 in accordance with some embodiments described herein.

FIGS. 3A-3C illustrate how some embodiments described herein allow adjustable threading in a clamshell configuration while supporting clean circuit board routing.

FIG. 3A illustrates a configuration with one memory module in accordance with some embodiments described herein.

Memory module 302 can be populated in one slot, and continuity module 304 can be populated in the other slot. Memory module 302 can include multiple memory devices, such as memory devices 310 and 314 arranged in a clamshell configuration (memory device 314 is in front, and memory device 310 is at the back). For memory devices 310 and 314, command and address information can be routed over fly-by paths 306 and 316, and data can be routed over direct path 308. Continuity module 304 does not include any memory devices. However, as shown in FIG. 3A, continuity module 304 may include wiring to route CA interface signals and/or data interface signals.

The configuration shown in FIG. 3A supports four CA interfaces, namely CA0, CA1, CA2, and CA3. Each CA interface may include multiple pins. For example, CA interface CA0 may comprise six pins: CA0[0]-CA0[5].

In order to use system resources efficiently, it may be desirable to support a total of four threads in FIG. 3A. Specifically, CA interfaces CA0 and CA1 can be used for supporting two microthreads, and CA interfaces CA2 and CA3 can be used for supporting two other microthreads.

In some embodiments, this can be achieved by routing the signals as follows. The signals received on CA interfaces CA1 and CA2 can be directly provided to the corresponding pins on memory module 302. The signals received on CA interfaces CA0 and CA3 can be provided to corresponding pins on continuity module 304. Electrical connections on continuity module 304 and the circuit board can then be used to route the CA0 and CA3 interface signals to corresponding pins on memory module 302.

FIG. 3B illustrates a configuration with two memory modules in accordance with some embodiments described herein.

Memory module 302 can be populated in one slot, and memory module 312 can be populated in the other slot. In order to use system resources efficiently, it may be desirable to support a total of four threads in FIG. 3B.

Specifically, the four CA interfaces CA0, CA1, CA2, and CA3 can be used for supporting the four threads. In some embodiments, this can be achieved by routing the signals as follows. The signals received on CA interfaces CA1 and CA2 can be directly provided to the corresponding pins on memory module 302. The signals received on CA interfaces CA0 and CA3 can be directly provided to the corresponding pins on memory module 312.

As shown in FIG. 3B, some of the CA interface pins that were used in FIG. 3A are disabled in FIG. 3B since these CA interfaces are not used in FIG. 3B.

FIG. 3C illustrates a cross-section of a portion of memory module 302 in accordance with some embodiments described herein.

Memory devices 310 and 314 can be on opposite sides of circuit board 318. Signal multi-drop lines 320 and 322 can supply CA interface signals to memory devices 310 and 314. Specifically, signal multi-drop lines 320 and 322 can correspond to fly-by paths 306 and 316, respectively. Memory devices 310 and 314 can include configurable CA interfaces (shown as CAA and CAB in FIG. 3C).

Since memory device 310 and 314 are arranged in a clamshell configuration, CA interface CAA of memory device 310 is aligned with CA interface CAB of memory device 314, and CA interface CAB of memory device 310 is aligned with CA interface CAA of memory device 314.

As shown in FIG. 3C, circuit board wires can be cleanly routed as follows: (1) at least some wires in signal multi-drop line 320 can be electrically connected with CA interface CAA of memory device 310 and CA interface CAB of memory device 314, and (2) at least some wires in signal multi-drop line 322 can be electrically connected with CA interface CAB of memory device 310 and CA interface CAA of memory device 314. Note that routing wires in this fashion reduces the wire lengths that are required to electrically connect the CA interface pins with the corresponding wires in the signal multi-drop line.

When both CA interfaces are active in each memory device (e.g., as shown in FIG. 3A), the CA interface signals can be provided as follows: (1) signal multi-drop line 320 can carry signals for CA interface CAA of memory device 310 and CA interface CAB of memory device 314, and (2)

signal multi-drop line 322 can carry signals for CA interface CAB of memory device 310 and CA interface CAA of memory device 314.

When only one CA interface is active in each memory device (e.g., as shown in FIG. 3B), the CA interface signals can be provided as follows: (1) signal multi-drop line 320 can carry signals for CA interface CAA of memory device 310 and CA interface CAB of memory device 314, and (2) signal multi-drop line 322 can be disabled. This configuration is shown in FIG. 3C (the active and disabled CA channels have been highlighted).

Note that when only one CA interface is active per memory device, different CA interfaces may need to be selected in the two memory devices because they are arranged in a clamshell configuration. For example, as shown in FIG. 3C, CA interface CAA must be selected as the active interface in memory device 310, and CA interface CAB must be selected as the active CA interface in memory device 314.

As explained above in reference to FIGS. 2A-2E, some embodiments described herein are capable of selecting a particular CA interface as the active interface when the memory device is operated in a mode in which only one CA interface is active. In the absence of this capability, the clean circuit board routing in the clamshell configuration illustrated in FIG. 3C would not have been possible in an operational mode in which only one CA interface is active per memory device.

In some embodiments, the operational mode and/or the active CA interface of a memory can be selected based on one or more bits of one or more registers and/or one or more signals received on one or more pins. For example, in FIG. 3C, the operational mode and/or the active CA interface of memory device 310 can be selected based on one or more bits of register 324.

Embodiments described herein can be used with other configurations having different numbers of module threads and/or microthreads. For example, FIGS. 3D-3E illustrate configurations that are different from the configurations shown in FIGS. 3A-3C.

Figure 3D:
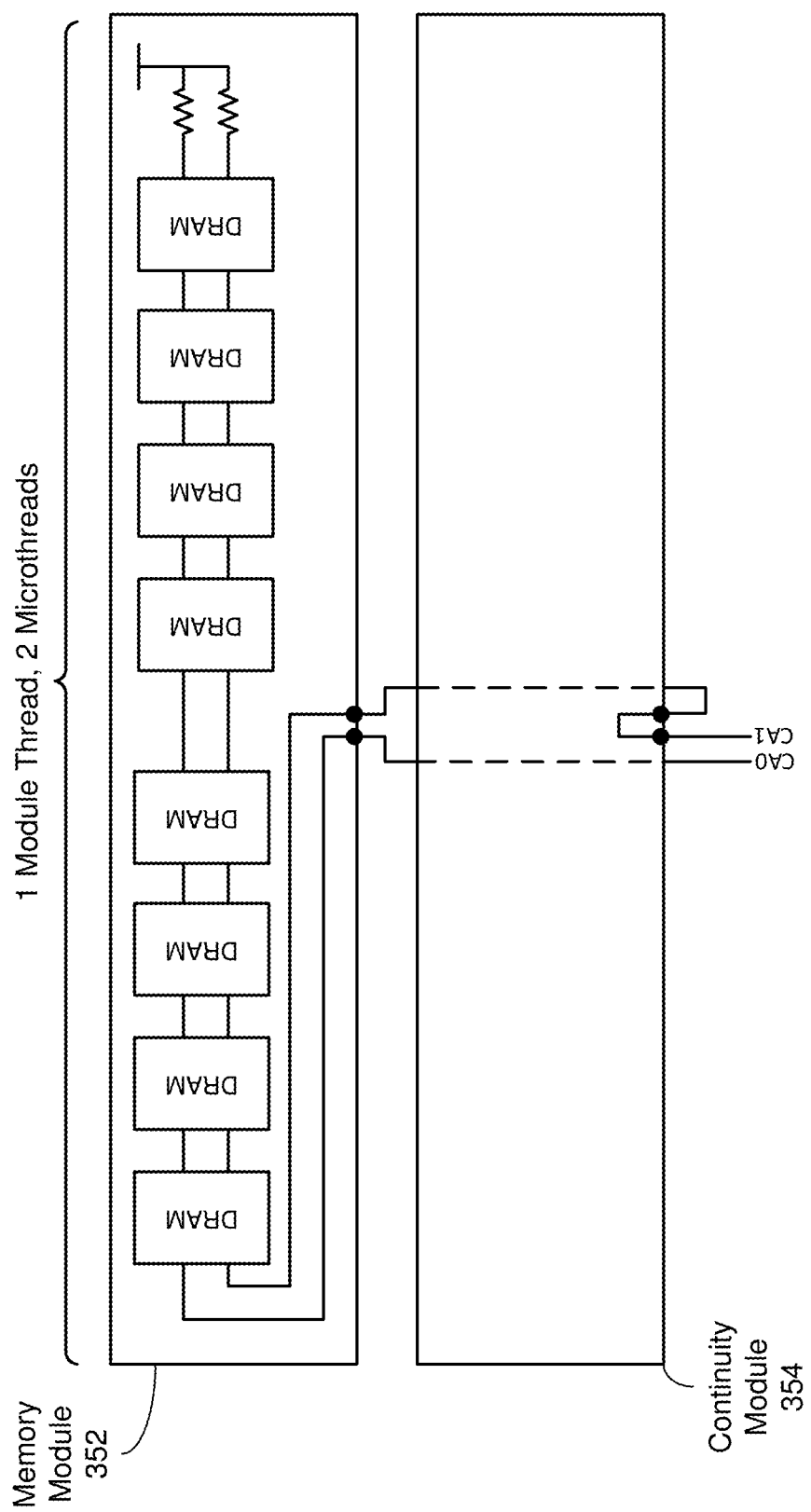
FIG. 3D illustrates a configuration with one memory module in accordance with some embodiments described herein.
Figure 3E:
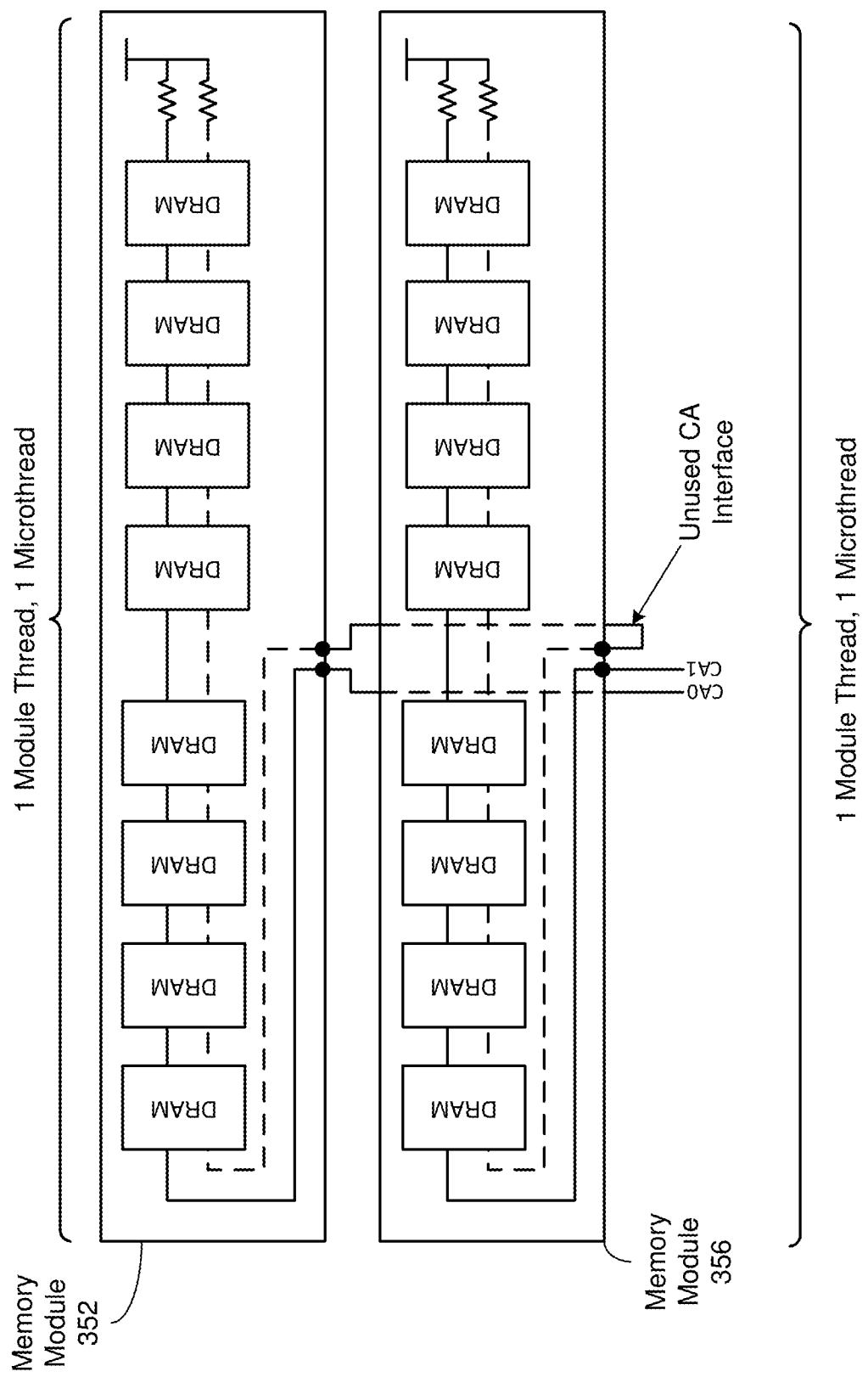
FIG. 3E illustrates a configuration with two memory modules in accordance with some embodiments described herein.

FIG. 3D illustrates a configuration with one memory module in accordance with some embodiments described herein.

Memory module 352 can be populated in one slot, and continuity module 354 can be populated in the other slot. Memory module 352 can include multiple memory devices. Continuity module 354 may include wiring to route CA interface signals. The configuration shown in FIG. 3D supports two CA interfaces, namely CA0 and CA1.

In order to use system resources efficiently, it may be desirable to support a total of two threads in FIG. 3D. For example, in some embodiments, CA interfaces CA0 and CA1 can be used for supporting two microthreads. In some embodiments, this can be achieved by routing the signals as follows. The signals received on CA interface CA0 can be directly provided to the corresponding pins on memory module 352. The signals received on CA interface CA1 can be provided to corresponding pins on continuity module 354. Electrical connections on continuity module 354 and the circuit board can then be used to route the CA0 and CA1 interface signals to corresponding pins on memory module 352.

FIG. 3E illustrates a configuration with two memory modules in accordance with some embodiments described herein.

Memory module 352 can be populated in one slot, and memory module 356 can be populated in the other slot. Memory modules 352 and 356 can each include multiple memory devices.

In order to use system resources efficiently, it may be desirable to support a total of two threads in FIG. 3E. In some embodiments, this can be achieved by routing the signals as follows. The signals received on CA interface CA0 can be provided to the corresponding pins on memory module 352. The signals received on CA interface CA1 can be provided to corresponding pins on memory module 356. As shown in FIG. 3E, some of the CA interface pins that were used in FIG. 3D are disabled in FIG. 3E since these CA interfaces are not used in FIG. 3E.

Some embodiments described herein facilitate wire bonding in IC packages that include a stack of multiple dies. An IC package that includes a stack of dies may also be referred to as a die-on-die package.

Figure 4A:
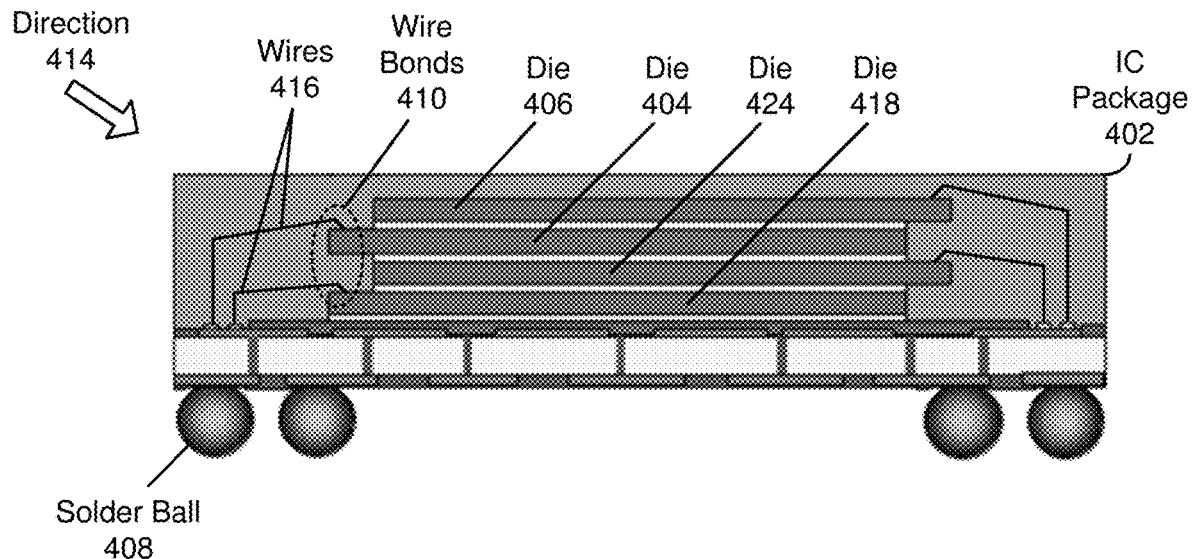
FIG. 4A illustrates an IC package with a stack of multiple dies in accordance with some embodiments described herein.

FIG. 4A illustrates an IC package with a stack of multiple dies in accordance with some embodiments described herein.

IC package 402 can include multiple dies, such as dies 404, 406, 418, and 424. In some embodiments, dies 404 and 418 can each be a memory device, and may have conducting regions that correspond to one or more CA interfaces. Wires 416 can be used to create electrical connections between two or more conducting regions on one or more dies, and/or between a solder ball (e.g., solder ball 408) and one or more conducting regions on one or more dies.

Wire bonds electrically connect a set of wires to the corresponding conducting regions of a die. Wire bonds are often required to satisfy a number of constraints, such as the maximum bonding angle, pad pitch, and wire-to-wire clearance, etc.

Figure 4B:
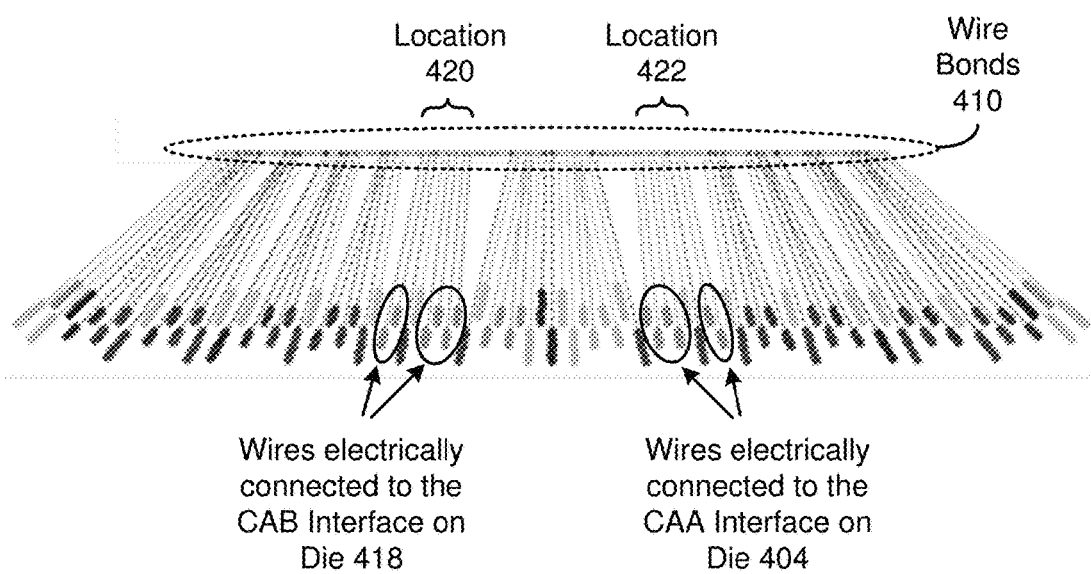
FIG. 4B illustrates the wire bonds when the IC package in FIG. 4A is viewed from the left side in accordance with some embodiments described herein.

FIG. 4B illustrates another view of an IC package in accordance with some embodiments described herein. Specifically, the view shown in FIG. 4B may correspond to a view of IC package 402 when viewed along direction 414.

The memory devices on dies 404 and 418 may support two CA interfaces: CAA and CAB. As explained in reference to FIGS. 2A-2E, CA interfaces CAA and CAB can be used to control a portion of the memory resources or all of the memory resources depending on the operational mode.

The CAA and CAB interfaces of the memory devices in dies 404 and 418 may be located on top of one another. For example, as shown in FIG. 4B, the CAB interface of the memory devices in dies 404 and 418 may be located at location 420, and the CAA interface of the memory devices in dies 404 and 418 may be located at location 422. In some embodiments, the corresponding CA interfaces of the two dies may be substantially vertically aligned with one another.

It may be difficult, if not impossible, to satisfy a set of design constraints when one set of wires is bonded to CA interface CAA on die 404 and another set of wires is bonded to CA interface CAA on die 418. Similarly, due to CA routing constraints on the package substrate for routing wires between BGA balls and wirebond pads, it may be difficult to bond the same CA interface on both dies. This may be especially true for packages that require compatible CA signal BGA ball assignment for a single die bonded to one side of the package, or multiple stacked die bonded to the same side of the package.

However, it may be possible to bond wires to different CA interface on different dies. For example, as shown in FIG. 4B, it may be possible to bond one set of wires to CA interface CAA on die 404 and another set of wires to CA interface CAB on die 418. In this example, CA interface CAA can be selected as the active CA interface on die 404, and CA interface CAB can be selected as the active CA interface on die 418. A CA interface that is not selected as an active CA interface can be considered to be inactive (e.g., CA interface CAB on die 404 and CA interface CAA on die 418 are inactive in the example shown in FIG. 4B).

Note that, in order to bond wires as shown in FIG. 4B, the memory devices need to be capable of selecting an active CA interface from a set of CA interfaces. Specifically, as described herein, some embodiments facilitate wire bonding in IC packages that include a stack of multiple memory devices by allowing different memory devices to select different CA interfaces as their active CA interfaces.

Figure 5:
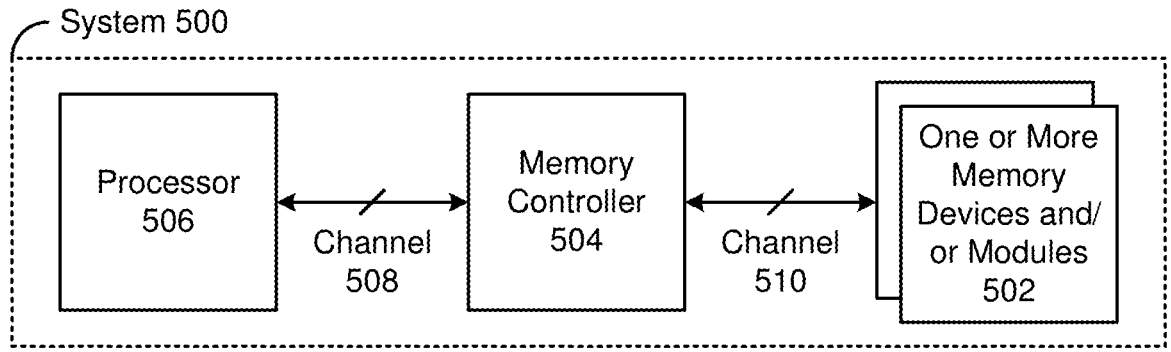
FIG. 5 illustrates a system in accordance with some embodiments described herein.

FIG. 5 illustrates a system in accordance with some embodiments described herein.

System 500 can include processor 506, memory controller 504, and one or more memory devices and/or modules 502. Each memory device in the one or more memory devices and/or modules 502 can have two or more configurable CA interfaces and/or data interfaces.

The term "system" as used in this disclosure can generally refer to a hardware-based apparatus that includes a data processing mechanism and a storage mechanism. Examples of data processing mechanisms include, but are not limited to, microprocessors, graphics processors, network processors, application-specific integrated circuits, or any other circuitry capable of performing computations. Examples of storage mechanisms include, but are not limited to, volatile and/or non-volatile memory devices, caches, disk storage units, and/or any other hardware-based mechanism that is capable of storing data. Examples of systems include, but are not limited to, a personal computer, a laptop, a tablet computer, a smartphone, a system on a chip (SoC), and/or any other hardware-based apparatus that is capable of storing data and performing computations on the stored data.

Processor 506 can be coupled to memory controller 504 via bidirectional communication channel 508 (e.g., a system bus), and memory controller 504 can be coupled to one or more memory devices and/or modules via bidirectional communication channel 510 (e.g., a memory bus).

In some embodiments, memory controller 504 can configure one or more CA interfaces and/or data interfaces in one or more memory devices and/or modules 502 by storing one or more values in one or more registers and/or by providing one or more signals on one or more pins of one or more memory devices and/or modules 502.

In some embodiments, memory controller 504 can configure one or more CA interfaces and/or data interfaces in one or more memory devices and/or modules 502 based on the number and/or type of memory devices and/or modules. In some embodiments, memory controller 504 can configure one or more CA interfaces and/or data interfaces in one or more memory devices and/or modules 502 based on stored configuration settings (e.g., configuration settings stored in a register in memory controller 504) and/or based on configuration information received from processor 506.

Figure 6:
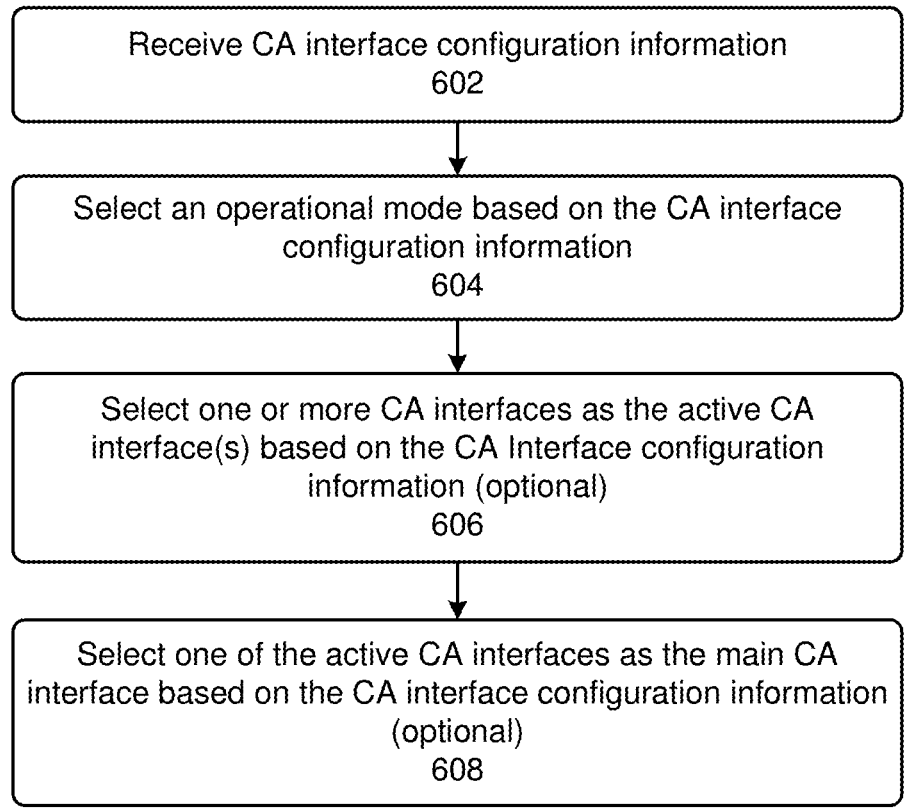
FIG. 6 presents a flowchart that illustrates a process in accordance with some embodiments described herein.

FIG. 6 presents a flowchart that illustrates a process in accordance with some embodiments described herein.

The process illustrated in FIG. 6 may be performed by one or more memory devices and/or modules 502 based on CA interface configuration information received from memory controller 504, which, in turn, may have received the CA interface configuration information from processor 506.

The process can begin with a memory device receiving CA interface configuration information (operation 602).

Next, the memory device can select an operational mode based on the CA interface configuration information (operation 604).

If the operational mode requires all CA interfaces to be active, then the configuration process can be deemed complete at this point. On the other hand, if the operational mode requires only some of the CA interface to be active, then the memory device can select one or more CA interfaces as the active CA interface(s) based on the CA interface configuration information (operation 606).

If multiple CA interfaces are active in an operational mode, then, in some embodiments, the memory device may select one of the active CA interfaces as the main CA interface based on the CA interface configuration information (operation 608).

Figure 7A:
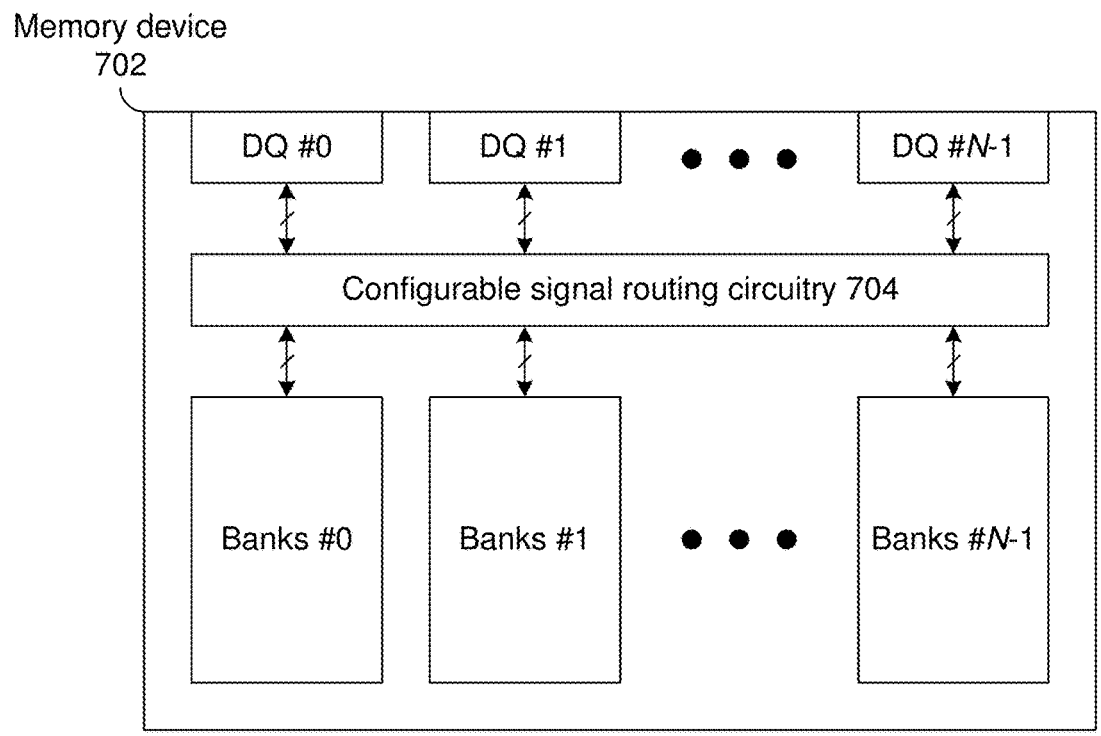
FIG. 7A illustrates a memory device in accordance with some embodiments described herein.

FIG. 7A illustrates a memory device in accordance with some embodiments described herein.

Memory device 702 can include N data interfaces shown as DQ #0 through DQ #N−1 in FIG. 7A. Each data interface can correspond to a contiguous set of pins which can include a strobe signal, a data mask signal, and/or a set of data signals. In some embodiments, it may be preferable to treat all of the signals in a data interface as an atomic unit. In these embodiments, the contiguous set of pins corresponding to a data interface cannot be unbundled. Therefore, in these embodiments, when a data interface is selected as an active data interface, all of the pins in the corresponding contiguous set of pins are considered to be active.

Memory device 702 may be capable of operating in multiple operating modes. In one operating mode, all of the data interfaces may be active. In a second operating mode, only some of the data interfaces may be active. Memory interface 702 may select which data interfaces are active based on one or more bits of one or more registers and/or one or more signals received on one or more pins.

Memory device 702 can include multiple memory banks, e.g., Banks #0 through Banks #M−1, where M≥N (i.e., the number of memory banks can be greater than or equal to the number of data interfaces). Each data interface may be capable of accessing data from one or more memory banks. Configurable signal routing circuitry 704 may be used to route signals from the memory banks to the appropriate data interface pins. Many variations and modifications to the embodiment illustrated in FIG. 7A will be readily apparent to those skilled in the art. Some of these embodiments are now discussed.

Figure 7B:
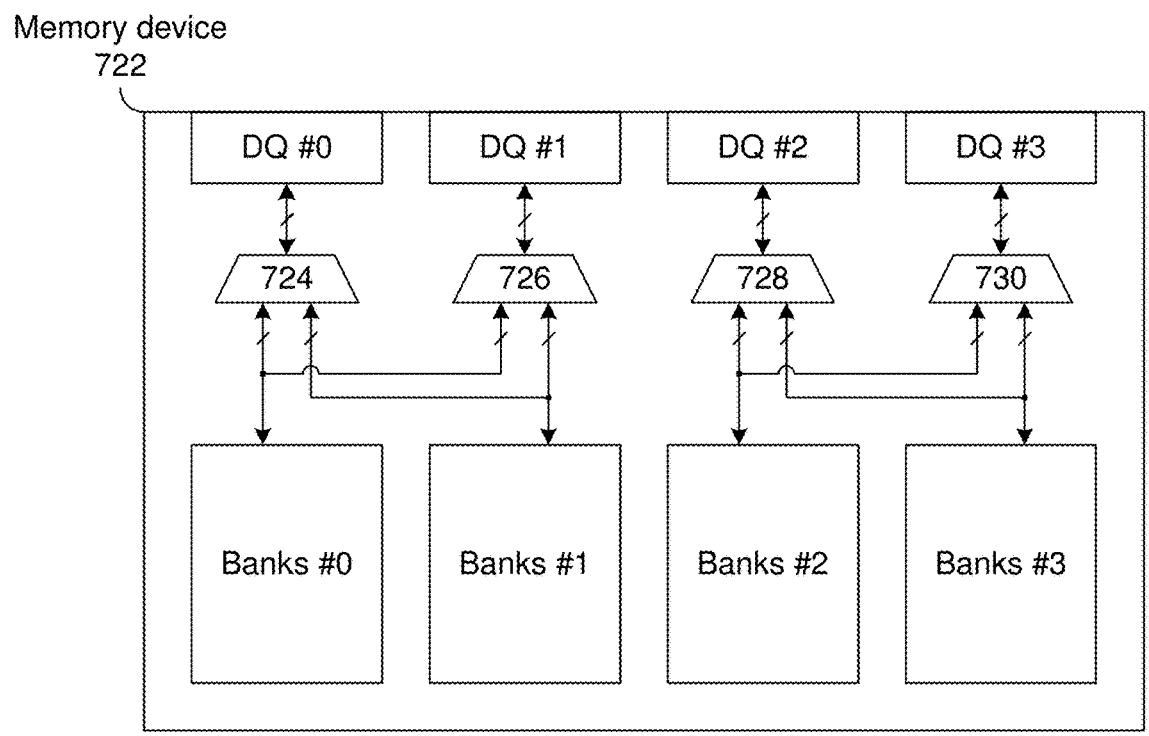
FIG. 7B illustrates a memory device in accordance with some embodiments described herein.

FIG. 7B illustrates a memory device in accordance with some embodiments described herein. The memory device illustrated in FIG. 7B can be an embodiment of the memory device illustrated in FIG. 7A.

Memory device 722 can include data interfaces DQ #0 through DQ #3, multiplexers 724-730, and memory banks, e.g., Banks #0 through Banks #3. In one operational mode, all of the data interfaces can be active. In this operational mode, multiplexers 724-730 can route signals from Banks #0-#3 to data interfaces DQ #0-DQ #3, respectively. In a second operational mode, only data interface DQ #0 and DQ #2 may be active. In this operational mode, multiplexer 724 can route signals from Banks #0 or #1 to data interface DQ #0, and multiplexer 728 can route signals from Banks #2 or #3 to data interface DQ #2. Other operational modes are also possible. For example, in a third operational mode, data interfaces DQ #1 and DQ #3 may be active. In this operational mode, multiplexers 726 and 730 may route signals from the appropriate memory banks to data interfaces DQ #1 and DQ #3.

Figure 7C:
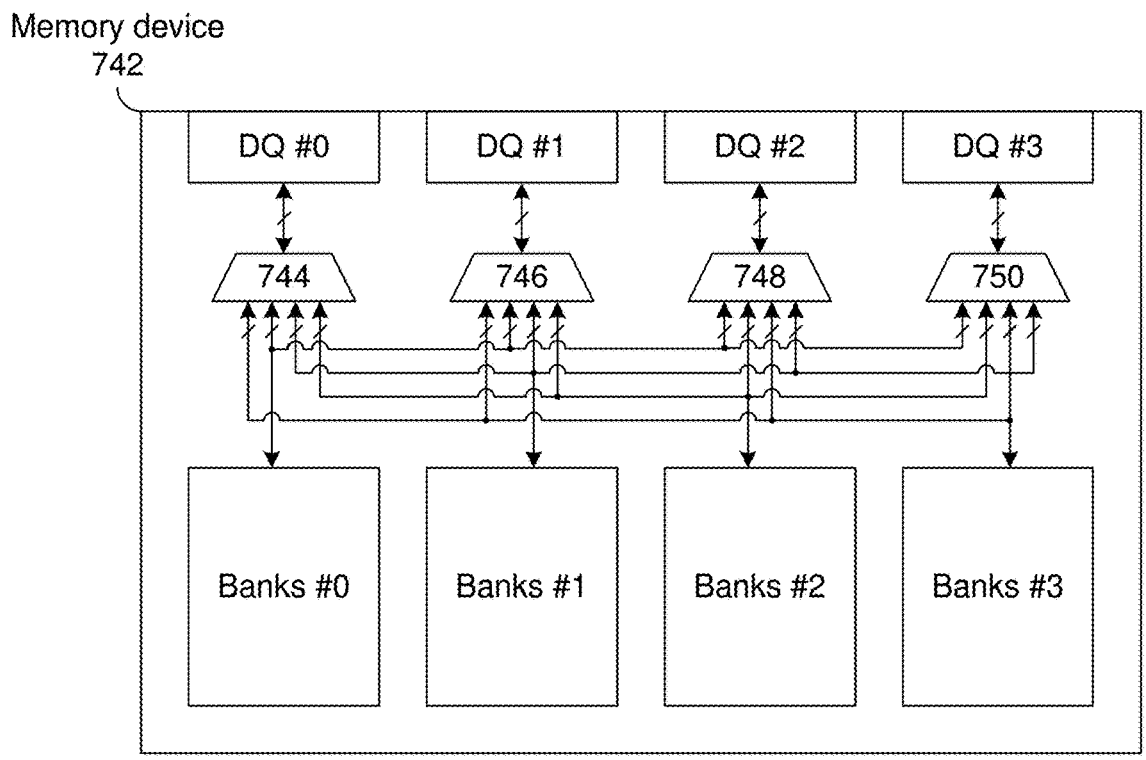
FIG. 7C illustrates a memory device in accordance with some embodiments described herein.

FIG. 7C illustrates a memory device in accordance with some embodiments described herein. The memory device illustrated in FIG. 7C can be an embodiment of the memory device illustrated in FIG. 7A.

Memory device 742 can include data interfaces DQ #0 through DQ #3, multiplexers 744-750, and memory banks, e.g., Banks #0 through Banks #3. In one operational mode, all of the data interfaces can be active. In this operational mode, multiplexers 744-750 can route signals from Banks #0-#3 to data interfaces DQ #0-DQ #3. In a second operational mode, only data interface DQ #0 and DQ #2 may be active. In this operational mode, multiplexer 744 can route signals from Banks #0-#3 to data interface DQ #0, and multiplexer 748 can route signals from Banks #0-#3 to data interface DQ #2. Other operational modes are also possible. For example, in a third operational mode, only data interface DQ #0 may be active. In this operational mode, multiplexer 744 may route the signals from Banks #0-#3 to data interface DQ #0.

Figure 7D:
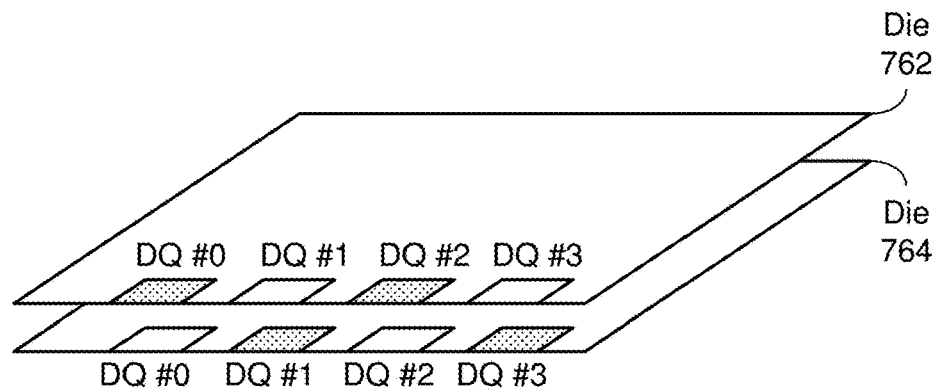
FIG. 7D illustrates a stack of two dies which include memory devices in accordance with some embodiments described herein.

FIG. 7D illustrates a stack of two dies which include memory devices in accordance with some embodiments described herein.

Die 762 can include a memory device having four data interfaces DQ #0-DQ #3, and die 764 can include a memory device having four data interface DQ #0-DQ #3. In some configurations, only some of the data interfaces may be active in each die. For example, in some configurations, only two of the four data interfaces may be active.

Wire bonding in an IC package usually needs to satisfy a set of design constraints (e.g., maximum bonding angle, pad pitch, and wire-to-wire clearance, etc.) that are based on manufacturability and/or performance considerations. For example, it may be difficult, if not impossible, to satisfy a set of design constraints when one set of wires is bonded to data interface DQ #0 on die 762 and another set of wires is bonded to data interface DQ #0 on die 764.

However, it may be possible to satisfy the set of design constraints by bonding wires to different data interface on different dies. For example, one set of wires can be bonded to data interfaces DQ #0 and DQ #2 on die 762 and another set of wires can be bonded to data interfaces DQ #1 and DQ #3 on die 764. In this example, data interfaces DQ #0 and DQ #2 can be selected as the active data interfaces on die 762, and data interfaces DQ #1 and DQ #3 can be selected as the active data interfaces on die 764 (the active data interfaces have been shaded in FIG. 7D). As illustrated in FIG. 7D, some embodiments facilitate wire bonding in IC packages that include a stack of multiple dies having memory devices by allowing different memory devices to select different data interfaces as their active data interfaces.

Figure 8:
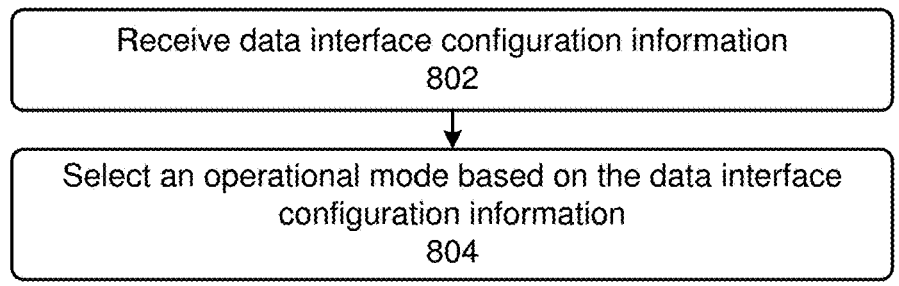
FIG. 8 presents a flowchart that illustrates a process in accordance with some embodiments described herein.

FIG. 8 presents a flowchart that illustrates a process in accordance with some embodiments described herein.

The process illustrated in FIG. 8 may be performed by one or more memory devices and/or modules 502 (see FIG. 5) based on data interface configuration information received from memory controller 504, which, in turn, may have received the data interface configuration information from processor 506.

The process can begin with a memory device receiving data interface configuration information (operation 802). Next, the memory device can select an operational mode based on the data interface configuration information (operation 804). The operational mode may dictate which data interfaces are active and which are inactive. In some embodiments, the data interface configuration information may explicitly indicate which data interfaces are active and which are inactive, and the memory device may configure the data interfaces accordingly.

Various modifications to the disclosed embodiments will be readily apparent to those skilled in the art, and the general principles defined herein may be applied to other embodiments and applications without departing from the spirit and scope of the present disclosure. Thus, the scope of the present disclosure is not limited to the embodiments shown, but is to be accorded the widest scope consistent with the principles and features disclosed herein.

What is claimed is:

1. A dynamic random access memory device, comprising:
   a first set of pins located on a first side of a line of symmetry, the first set of pins corresponding to a first command-and-address (CA) interface;
   a second set of pins located on a second side of the line of symmetry and in a mirror configuration with respect to the first set of pins, the second set of pins corresponding to a second CA interface; and
   circuitry to receive, via the first set of pins, a first command that specifies a first memory access, and, the circuitry to receive, via the second set of pins, a second command that specifies a second memory access.

2. The dynamic random access memory device of claim 1, wherein each pin in the first set of pins mirrors a respective pin in the second set of pins across the line of symmetry.

3. The dynamic random access memory device of claim 1, wherein the first set of pins and the second set of pins are suitably arranged for use in a clamshell configuration.

4. The dynamic random access memory device of claim 1, further comprising a data interface to transfer data corresponding to the first memory access and the second memory access, wherein the data interface includes a programmable number of pins.

5. The dynamic random access memory device of claim 1, wherein the line of symmetry does not include pins.

6. The dynamic random access memory device of claim 5, wherein a row of pin locations adjacent to the line of symmetry does not include pins.

7. The dynamic random access memory device of claim 1, wherein each pin is a solder ball in a ball-grid-array.

8. A dynamic random access memory device, comprising:
   a set of pins symmetrically arranged on both sides of a line of symmetry;
   a first subset of the set of pins located on a first side of the line of symmetry, the first subset of the set of pins corresponding to a first command-and-address (CA) interface;
   a second subset of the set of pins located on a second side of the line of symmetry and in a mirror configuration with respect to the first subset of the set of pins, the second subset of the set of pins corresponding to a second CA interface; and
   circuitry to receive, via the first subset of the set of pins, a first command that specifies a first memory access, and, the circuitry to receive, via the second subset of the set of pins, a second command that specifies a second memory access.

9. The dynamic random access memory device of claim 8, wherein each pin in the first subset of the set of pins mirrors a respective pin in the second subset of the set of pins across the line of symmetry.

10. The dynamic random access memory device of claim 8, wherein the set of pins is suitably arranged for use in a clamshell configuration.

11. The dynamic random access memory device of claim 8, further comprising a data interface to transfer data corresponding to the first memory access and the second memory access, wherein the data interface includes a programmable number of pins.

12. The dynamic random access memory device of claim 8, wherein the line of symmetry does not include pins.

13. The dynamic random access memory device of claim 12, wherein a row of pin locations adjacent to the line of symmetry does not include pins.

14. The dynamic random access memory device of claim 8, wherein each pin is a solder ball in a ball-grid-array.

15. A dynamic random access memory device, comprising:
- a set of pins symmetrically arranged on both sides of a line of symmetry, wherein the set of pins is suitably arranged for use in a clamshell configuration;
- a first subset of the set of pins located on a first side of the line of symmetry, the first subset of the set of pins corresponding to a first command-and-address (CA) interface;
- a second subset of the set of pins located on a second side of the line of symmetry and in a mirror configuration with respect to the first subset of the set of pins, the second subset of the set of pins corresponding to a second CA interface; and
- circuitry to receive, via the first subset of the set of pins, a first command that specifies a first memory access, and, the circuitry to receive, via the second subset of the set of pins, a second command that specifies a second memory access.

16. The dynamic random access memory device of claim 15, wherein each pin in the first subset of the set of pins mirrors a respective pin in the second subset of the set of pins across the line of symmetry.

17. The dynamic random access memory device of claim 15, further comprising a data interface to transfer data corresponding to the first memory access and the second memory access, wherein the data interface includes a programmable number of pins.

18. The dynamic random access memory device of claim 15, wherein the line of symmetry does not include pins.

19. The dynamic random access memory device of claim 18, wherein a row of pin locations adjacent to the line of symmetry does not include pins.

20. The dynamic random access memory device of claim 15, wherein each pin is a solder ball in a ball-grid-array.

* * * * *